United States Patent
Lojek et al.

(10) Patent No.: US 7,569,458 B2
(45) Date of Patent: Aug. 4, 2009

(54) NON-THERMALLY ANNEALED DOPED SEMICONDUCTOR MATERIAL AND METHODS RELATED THERETO

(75) Inventors: Bohumil Lojek, Colorado Springs, CO (US); Michael D. Whiteman, Woodland Park, CO (US)

(73) Assignee: Atmel Corporation, San Jose, CA (US)

( * ) Notice: Subject to any disclaimer, the term of this patent is extended or adjusted under 35 U.S.C. 154(b) by 277 days.

(21) Appl. No.: 11/674,065

(22) Filed: Feb. 12, 2007

(65) Prior Publication Data

US 2007/0141817 A1    Jun. 21, 2007

Related U.S. Application Data

(63) Continuation of application No. 11/112,643, filed on Apr. 22, 2005, now Pat. No. 7,176,112.

(51) Int. Cl.
*H01L 21/336* (2006.01)
*H01L 23/552* (2006.01)

(52) U.S. Cl. ............... 438/308; 438/378; 438/535; 257/659; 257/E21.471; 257/E21.475

(58) Field of Classification Search ............ 438/308, 438/378, 473, 535, 795
See application file for complete search history.

(56) References Cited

U.S. PATENT DOCUMENTS

| | | | |
|---|---|---|---|
| 4,303,455 A | 12/1981 | Splinter et al. | |
| 4,439,245 A * | 3/1984 | Wu | 117/8 |
| 4,474,625 A | 10/1984 | Cohen et al. | |
| 5,395,794 A * | 3/1995 | Sklyarevich et al. | 438/535 |
| 5,626,670 A | 5/1997 | Varshney et al. | |
| 5,851,319 A | 12/1998 | Atwater et al. | |
| 5,917,195 A | 6/1999 | Brown | |
| 6,001,715 A | 12/1999 | Manka et al. | |
| 6,316,123 B1 | 11/2001 | Lee et al. | |
| 7,176,112 B2 | 2/2007 | Lojek | |
| 2004/0087118 A1 | 5/2004 | Maegawa et al. | |

FOREIGN PATENT DOCUMENTS

WO    WO-2006033724 A2    3/2006

* cited by examiner

*Primary Examiner*—Hsien-ming Lee
(74) *Attorney, Agent, or Firm*—Schwegman, Lundberg & Woessner, P.A.

(57) ABSTRACT

A method of non-thermal annealing of a silicon wafer comprising irradiating a doped silicon wafer with electromagnetic radiation in a wavelength or frequency range coinciding with lattice phonon frequencies of the doped semiconductor material. The wafer is annealed in an apparatus including a cavity and a radiation source of a wavelength ranging from 10-25 μm and more particularly 15-18 μm, or a frequency ranging from 12-30 THz and more particularly 16.5-20 THz.

17 Claims, 2 Drawing Sheets

NON-THERMALLY ANNEALED DOPED SEMICONDUCTOR MATERIAL AND METHODS RELATED THERETO

CROSS-REFERENCE TO RELATED APPLICATION

This is a continuation of patent application Ser. No. 11/112,643 filed Apr. 22, 2005, now U.S. Pat. No. 7,176,112 granted Feb. 13, 2007.

FIELD OF THE INVENTION

The invention relates to the annealing of crystalline materials, in general, and to a thermal annealing of doped semiconductor materials, in particular.

BACKGROUND OF THE INVENTION

After ion implantation, semiconductor wafers are annealed to remove any damage including near-surface lattice modification caused by the implantation and to activate dopants. Annealing treatments are intended to reduce or eliminate damage to the semiconductor material. For example, annealing occurs when the wafer is exposed to high temperatures ranging from 800° C. to 1100° C. Also, short pulses of laser or electron beam radiation can be used to heal damage to semiconductor crystals that occur during the implantation of impurities. However, prior art annealing techniques, especially high temperature annealing, may result in unwanted diffusion of impurities deteriorating quality of the resulting semiconductor device.

Thus, low temperature annealing techniques for promoting healing of damaged semiconductor regions are desired. For example, mechanical energy is used to anneal semiconductor wafers. As described in U.S. Pat. No. 6,001,715 to Manka et al., large amplitude sound waves created by laser ablation are used to anneal crystalline materials.

It is an object of the present invention to anneal semiconductors doped by ion-implantation or other doping methods which cause damage to the wafer.

It is an object of the present invention to provide a non-thermal process of annealing a doped semiconductor material.

It is an object of the present invention to provide a process of annealing a semiconductor material implanted with dopants.

It is an object of the present invention to provide a new and improved process of annealing semiconductors.

SUMMARY OF THE INVENTION

These and other objects have been met by a method of non-thermal annealing of a silicon material comprising irradiating a doped silicon material, such as a wafer, with electromagnetic radiation in a wavelength or frequency range coinciding with phonon frequencies in the doped semiconductor material. Although ideal pure crystals have a distinct phonon spectrum with very sharply defined wavelengths (see absorption peaks of FIG. 1) that would need to be matched precisely by an external irradiation source to achieve phonon resonance, real-world silicon wafers used for manufacturing integrated circuits contain impurities, deliberately introduced dopants, and crystal lattice defects that tend to spread out the phonon absorption bands. Therefore, a wavelength in the spread out phonon absorption region of a doped semiconductor material will cause sufficient phonon resonance to produce annealing of the material.

Wavelengths in the phonon absorption region of semiconductor materials having impurities, dopants, and/or crystal lattice defects range from 10-25 μm and more particularly from 15-18 μm (corresponding to a frequency range of 12-30 THz and more particularly from 16.5-20 THz). This wavelength or frequency is in the extreme end of the microwave region and coincides with the phonon absorption region of the spectrum for annealing. Too short a wavelength (or too high a frequency) i.e. less than 10 μm, and the dominant absorption becomes free carrier absorption with significant heating. Likewise, too low a frequency (or too long a wavelength) less than 12 THz, and other heat-inducing absorption mechanisms will be dominant. Note that the invention operates at a frequency far above an ordinary microwave oven of 2.45 GHz frequency and far longer than the visible light or near infrared wavelengths (<1 or 2 μm) of laser thermal annealing or Rapid Thermal Processing (RTP).

For non-thermal annealing of the present invention, the semiconductor material is placed in an apparatus including a cavity and a radiation source of a particular wavelength. In one embodiment, for maximum annealing effect, the semiconductor material should be positioned so that it coincides with the plane of a standing-wave peak. However, simply placing the wafer in the cavity in any desired position will suffice since the phonon absorption bands are relatively spread out.

DETAILED DESCRIPTION OF THE INVENTION

Figure 2:
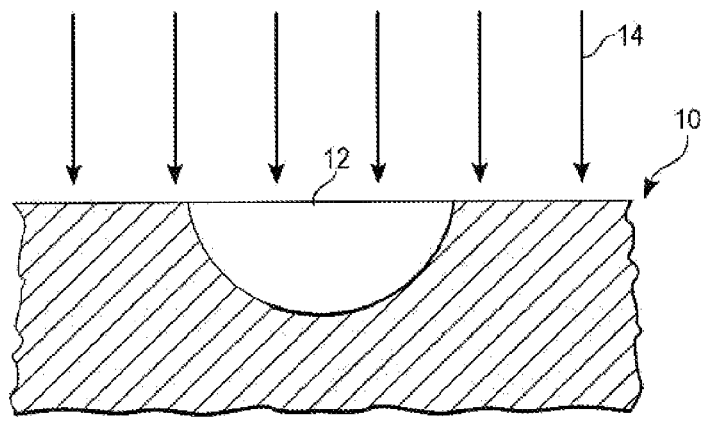
FIG. 2 is a simplified diagrammatic view of the annealing process of the present invention.

With reference to FIG. 2, the method according to the present invention comprises providing a typical semiconductor material 10, for example silicon or another crystalline material which has a doped region. In addition to purposefully introduced dopants, the material may include other impurities. After having undergone doping by a process (such as ion implantation) which damages the semiconductor material, the material is annealed to repair the damage by exposing the material to electromagnetic radiation in a wavelength or frequency range coinciding with a phonon frequency of the doped semiconductor material. An electromagnetic wave having a frequency coinciding with the phonon frequencies of the doped semiconductor material is indicated by the schematic beam 14 and is incident on the material 10. Reference numeral 12 indicates the position or region of the dopant after ion implantation or other doping process. Upon material exposure to the beam 14 within the frequency or wavelength coinciding with the phonon frequencies of the doped semiconductor material, the semiconductor material 10 is annealed. Enhanced phonon frequency is assumed to be responsible for the annealing mechanism. A specific wavelength range and a specific frequency range used for annealing in the present invention will be discussed below with regard to FIG. 4.

Figure 3:
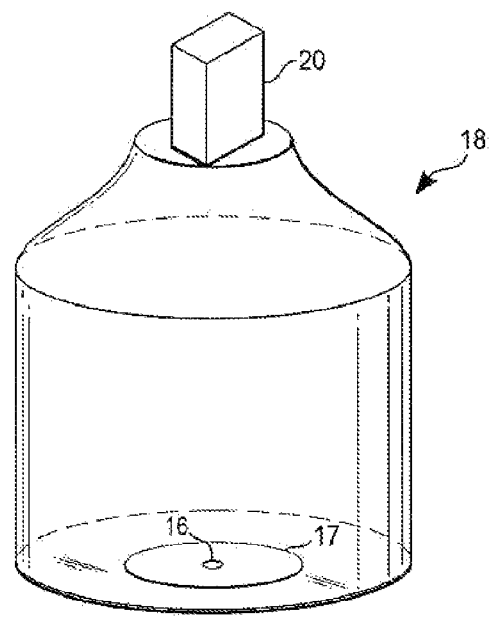
FIG. 3 is a perspective view of an apparatus for carrying out an annealing of a semiconductor according to the present invention.

Referring to FIG. 3, in accord with the method of the present invention, the semiconductor material 10, such as a silicon wafer 16, is placed inside a resonator cavity designated 18 coupled by way of a wave guide or traveling wave tube 20 to an electromagnetic generator such as a microwave and/or far infrared generator or free electron laser (not shown). The cavity may comprise for example, a metal material, or may further comprise a liner (not shown) to prevent contamination. The cavity may include a cylindrical shape and is at least large enough to accommodate the semiconductor material 10 to be treated. The material is situated in an area within the cavity. In a preferred embodiment, for maximum annealing effect, the material should be positioned so that it coincides with a particular plane of exciting waves in the cavity. For this purpose, a wafer holder 17 capable of micropositional adjustments or vibrations might be used. However, placing the material in the cavity 18 in any location where it may be irradiated usually suffices to achieve annealing. To achieve annealing, the generator is used to irradiate the semiconductor material within the cavity 18 with electromagnetic radiation in a wavelength or frequency range coinciding with phonon frequencies of the doped semiconductor material 10 or, more specifically, the doped region 12 of the semiconductor material for a pre-determined period. In one example, the semiconductor material is irradiated for a time period between 1-10 minutes, depending on the power incident on the wafer surface.

Figure 1:
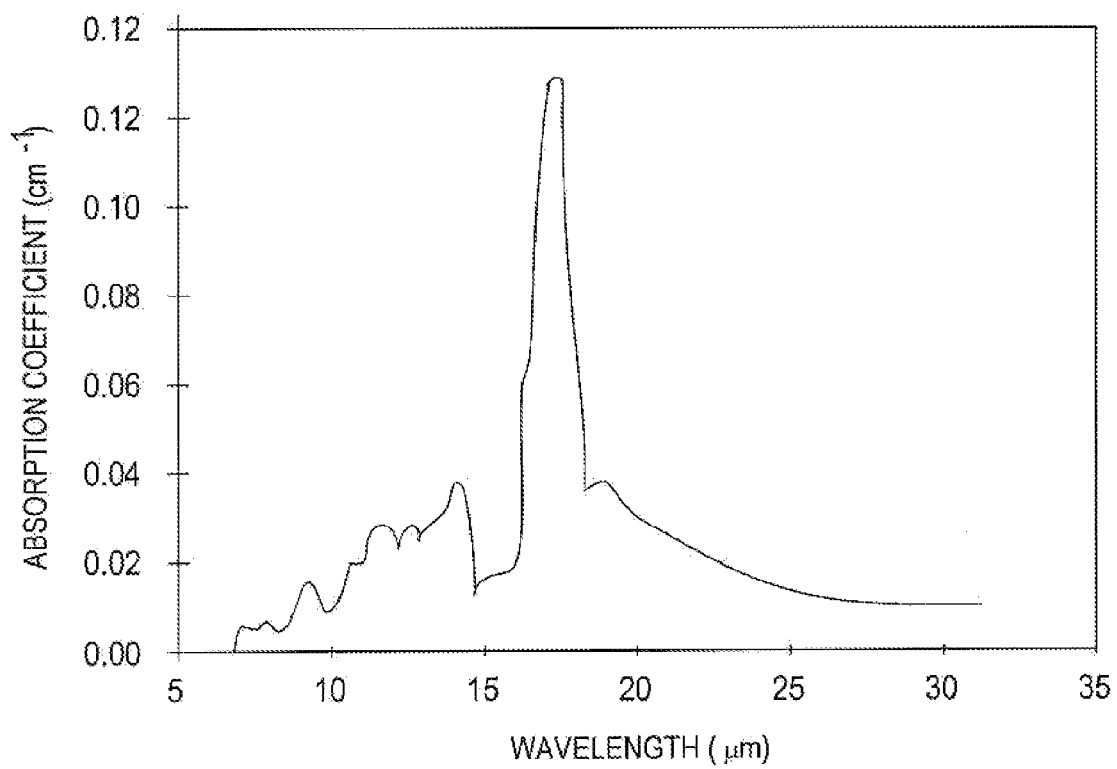
FIG. 1 is an absorption spectrum of intrinsic silicon in the range of 5 to 35 μm.
Figure 4:
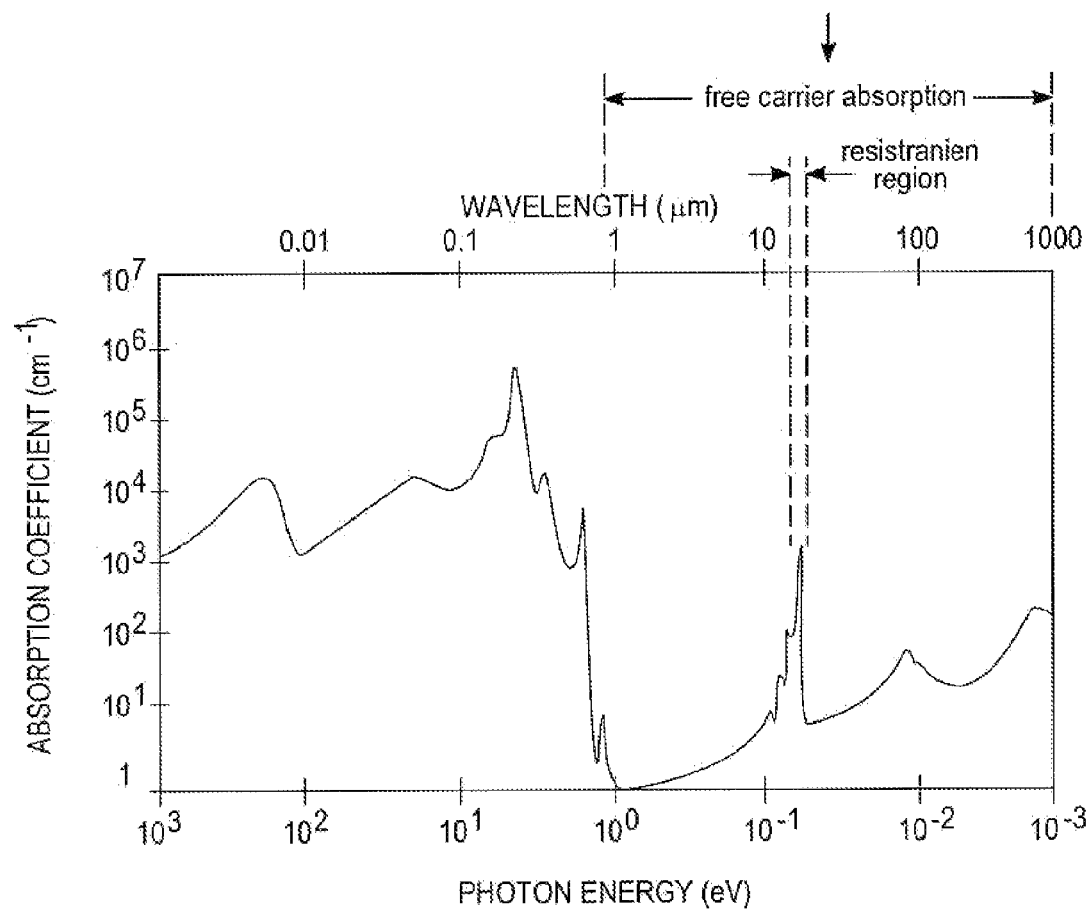
FIG. 4 is an absorption spectrum of a typical semiconductor in various absorption ranges including a phonon band absorption range.

A wavelength in the phonon frequency will cause enhancement of phonon resonance to produce annealing of the semiconductor material 10. FIG. 4 indicates the location of the phonon bands in the absorption spectrum. Wavelengths in the phonon frequency region (Reststrahlen region) of the typical semiconductor material which is doped range from 10-25 μm and more particularly from 15-18 μm. Frequencies of phonons of the typical semiconductor material, in particular silicon, range from 12-30 THz and more particularly from 16.5-20 THz. The phonon absorption ranges are spread out as compared to the phonon absorption range of pure silicon as seen in FIG. 1. Therefore, an exact wavelength is not required to resonate phonons. Instead a wavelength within the specified range will suffice. In one example, a 15 THz microwave generator was used.

Still referring to FIG. 4, it is seen that too short a wavelength (or too high a frequency) i.e. less than 10 μm (greater than 30 THz), and the dominant absorption becomes free carrier absorption with significant heating. Other heat-inducing absorption mechanisms may also occur with too short a wavelength. Too long a wavelength (or too low a frequency) i.e. greater than 25 μm (less than 12 THz) and free carrier absorption or other heat-inducing absorption mechanisms will become dominant. The invention does not contemplate use of any ordinary microwave oven 2.45 GHz frequencies.

In one test example, a silicon wafer having a thickness of 150 mm is implanted with $1.0 \times 10^{16}$ atoms of Arsenic @ 40 keV. After doping, the wafer is placed in the cavity 18 and exposed to electromagnetic radiation in a wavelength or frequency range coinciding with phonon absorption resonances of the doped semiconductor material for a period of 6-10 minutes. The maximum wafer temperature reached because of secondary absorption mechanisms like free carrier absorption is around 400° C.-450° C. for irradiation "pulses" on the order of 6-10 minutes. In the example, annealing of a doped layer of the wafer occurs after and during irradiation. In this example, annealing of Arsenic is not a complete annealing, though annealing does occur without excessive exposure to high temperatures.

The invention claimed is:

1. A method for annealing a doped semiconductor material comprising:
   non-thermally annealing the doped semiconductor material by directing a beam of electromagnetic radiation onto the doped semiconductor material at a frequency in the Terahertz (THz) range and a wavelength in the micrometer (μm) range to create phonon resonance in the doped semiconductor material.

2. The method of claim 1 wherein the doped semiconductor material is doped silicon.

3. The method of claim 1 wherein the electromagnetic radiation has a wavelength ranging from 10 μm to 25 μm.

4. The method of claim 1 wherein the electromagnetic radiation is provided by a microwave generator at a frequency ranging from 12 THz to 30 THz.

5. The method of claim 4 wherein the electromagnetic radiation has a wavelength ranging from 15 μm to 18 μm.

6. The method of claim 4 wherein the beam of electromagnetic radiation is directed at the doped semiconductor material for 1 minute to 10 minutes and the annealing is complete.

7. The method of claim 4 wherein a temperature of the doped semiconductor material is not greater than 450° C. during the annealing.

8. The method of claim 1 further comprising, prior to the non-thermally annealing step, doping semiconductor material by ion implantation to produce the doped semiconductor material.

9. The method of claim 8 wherein the semiconductor material is a wafer.

10. A method comprising non-thermally annealing a doped semiconductor material by irradiating a lattice of doped semiconductor material with electromagnetic radiation at a frequency of at least 12 Terahertz (THz) and a wavelength of at least 10 micrometers (μm), wherein the frequency and wavelength coincide with phonon frequencies in the lattice causing phonon resonance.

11. The method of claim 10 wherein the wavelength ranges from 10 μm to 25 μm.

12. The method of claim 11 further comprising maintaining the radiation at a frequency and wavelength sufficient to prevent the lattice from exceeding a temperature of 450° C.

13. The method of claim 10 further comprising maintaining the radiation at a frequency and wavelength sufficient to prevent the lattice from exceeding a temperature of 400° C.

14. The method of claim 10 wherein the irradiation is pulsed irradiation applied for 1 minute to 10 minutes.

15. A semiconductor material comprising:
   a non-thermally annealed doped semiconductor material annealed using electromagnetic radiation directed onto doped semiconductor material at a frequency in the Terahertz (THz) range and a wavelength in the micrometer (μm) range, wherein the resulting annealed doped semiconductor material has a more repaired surface as compared to an annealed doped semiconductor material annealed using a frequency in the Gigahertz (Ghz) range or a wavelength in the millimeter (mm) range.

16. The semiconductor material of claim 15 comprising a silicon material.

17. The semiconductor material of claim 15 wherein the semiconductor is a wafer.

* * * * *

UNITED STATES PATENT AND TRADEMARK OFFICE
CERTIFICATE OF CORRECTION

PATENT NO. : 7,569,458 B2
APPLICATION NO. : 11/674065
DATED : August 4, 2009
INVENTOR(S) : Lojek et al.

It is certified that error appears in the above-identified patent and that said Letters Patent is hereby corrected as shown below:

Drawings
On Sheet 1 of 2, in Fig. 1, line 1, delete "0.12" and insert -- 0.14 --, therefor. (Top left)

On Sheet 2 of 2, in Fig. 4, line 2, delete "resistranien" and insert -- reststrahlen --, therefor.

In column 1, line 15, delete "a thermal" and insert -- athermal --, therefor.

In column 2, line 20, after "For" insert -- the --.

In column 3, line 54, delete "any" and insert -- an --, therefor.

In column 3, line 54, after "oven" insert -- of --.

In column 4, line 59, in Claim 15, delete "(Ghz)" and insert -- (GHz) --, therefor.

Signed and Sealed this

Twenty-third Day of February, 2010

David J. Kappos
*Director of the United States Patent and Trademark Office*